(12) United States Patent
Cheng et al.

(10) Patent No.: US 9,224,827 B2
(45) Date of Patent: Dec. 29, 2015

(54) HIGH VOLTAGE RESISTOR

(71) Applicant: Taiwan Semiconductor Manufacturing Company, Ltd., Hsin-Chu (TW)

(72) Inventors: Chih-Chang Cheng, Hsinchu (TW); Ruey-Hsin Liu, Hsin-Chu (TW); Chih-Wen Yao, Hsinchu (TW); Ru-Yi Su, Kouhu Township (TW); Fu-Chih Yang, Fengshan (TW); Chun Lin Tsai, Hsin-Chu (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 91 days.

(21) Appl. No.: 14/074,435

(22) Filed: Nov. 7, 2013

(65) Prior Publication Data

US 2014/0057407 A1   Feb. 27, 2014

Related U.S. Application Data

(62) Division of application No. 12/905,840, filed on Oct. 15, 2010, now Pat. No. 8,587,073.

(51) Int. Cl.
| | |
|---|---|
| *H01L 21/20* | (2006.01) |
| *H01L 29/66* | (2006.01) |
| *H01L 23/522* | (2006.01) |
| *H01L 27/02* | (2006.01) |
| *H01L 27/08* | (2006.01) |

(52) U.S. Cl.
CPC ...... *H01L 29/66166* (2013.01); *H01L 23/5228* (2013.01); *H01L 27/0288* (2013.01); *H01L 27/0802* (2013.01); *H01L 2924/0002* (2013.01)

(58) Field of Classification Search
CPC ............ H01L 23/5228; H01L 27/0288; H01L 29/66166
USPC ......................................................... 438/383
See application file for complete search history.

(56) References Cited

U.S. PATENT DOCUMENTS

| | | | |
|---|---|---|---|
| 5,382,826 A | 1/1995 | Mojaradi et al. | |
| 6,110,804 A | 8/2000 | Parthasarathy et al. | |
| 6,680,515 B1 | 1/2004 | Hsing | |
| 7,196,397 B2 | 3/2007 | Chiola et al. | |
| 7,418,250 B2 | 8/2008 | Igarashi et al. | |
| 7,557,413 B2 | 7/2009 | Chen | |
| 7,638,405 B2 | 12/2009 | Hall et al. | |
| 7,709,908 B2 | 5/2010 | Su et al. | |
| 7,719,076 B2 | 5/2010 | Shu et al. | |

(Continued)

OTHER PUBLICATIONS

Koichi Endo et al., "A 500V 1A 1-Chip Inverter IC with a New Electric Field Reduction Structure", Proc. of the 6$^{th}$ Internat. Symposium on Power Semiconductor Devices & IC's, Switzerland, May 31-Jun. 2, 1994, IEEE Cat. No. 94CH3377-9, pp. 379-383.

*Primary Examiner* — Vongsavanh Sengdara
(74) *Attorney, Agent, or Firm* — Haynes and Boone, LLP

(57) ABSTRACT

Provided is a semiconductor device. The semiconductor device includes a resistor and a voltage protection device. The resistor has a spiral shape. The resistor has a first portion and a second portion. The voltage protection device includes a first doped region that is electrically coupled to the first portion of the resistor. The voltage protection device includes a second doped region that is electrically coupled to the second portion of the resistor. The first and second doped regions have opposite doping polarities.

20 Claims, 6 Drawing Sheets

(56) References Cited

U.S. PATENT DOCUMENTS

| | | | |
|---|---|---|---|
| 7,995,316 B2 | 8/2011 | Carpenter, Jr. et al. | |
| 2009/0236633 A1* | 9/2009 | Chuang et al. | 257/190 |
| 2011/0062554 A1* | 3/2011 | Hsing et al. | 257/536 |
| 2011/0068377 A1* | 3/2011 | Hsing et al. | 257/272 |
| 2011/0163376 A1 | 7/2011 | Cheng et al. | |
| 2012/0091529 A1 | 4/2012 | Cheng et al. | |

* cited by examiner

HIGH VOLTAGE RESISTOR

PRIORITY DATA

The present application is a divisional application of U.S. patent application Ser. No. 12/905,840, filed Oct. 15, 2010, which is incorporated by reference in its entirety.

BACKGROUND

The semiconductor integrated circuit (IC) industry has experienced rapid growth. Technological advances in IC materials and design have produced generations of ICs where each generation has smaller and more complex circuits than the previous generation. However, these advances have increased the complexity of processing and manufacturing ICs and, for these advances to be realized, similar developments in IC processing and manufacturing are needed. In the course of IC evolution, functional density (i.e., the number of interconnected devices per chip area) has generally increased while geometry size (i.e., the smallest component that can be created using a fabrication process) has decreased.

Various types of passive circuit components may be fabricated on a semiconductor wafer. For example, a resistor may be formed using one or more metal lines in a metal layer. However, traditional resistors on a semiconductor wafer cannot withstand a high voltage, for example a voltage greater than about 100 volts. Also, these traditional resistors lack design guidelines and may not have an efficient layout.

Therefore, while existing methods of fabricating semiconductor resistor devices have been generally adequate for their intended purposes, they have not been entirely satisfactory in every aspect.

BRIEF DESCRIPTION OF THE DRAWINGS

Aspects of the present disclosure are best understood from the following detailed description when read with the accompanying figures. It is emphasized that, in accordance with the standard practice in the industry, various features are not drawn to scale. In fact, the dimensions of the various features may be arbitrarily increased or reduced for clarity of discussion.

DETAILED DESCRIPTION

It is to be understood that the following disclosure provides many different embodiments, or examples, for implementing different features of the invention. Specific examples of components and arrangements are described below to simplify the present disclosure. These are, of course, merely examples and are not intended to be limiting. Moreover, the formation of a first feature over or on a second feature in the description that follows may include embodiments in which the first and second features are formed in direct contact, and may also include embodiments in which additional features may be formed interposing the first and second features, such that the first and second features may not be in direct contact. Various features may be arbitrarily drawn in different scales for the sake of simplicity and clarity.

Figure 1:
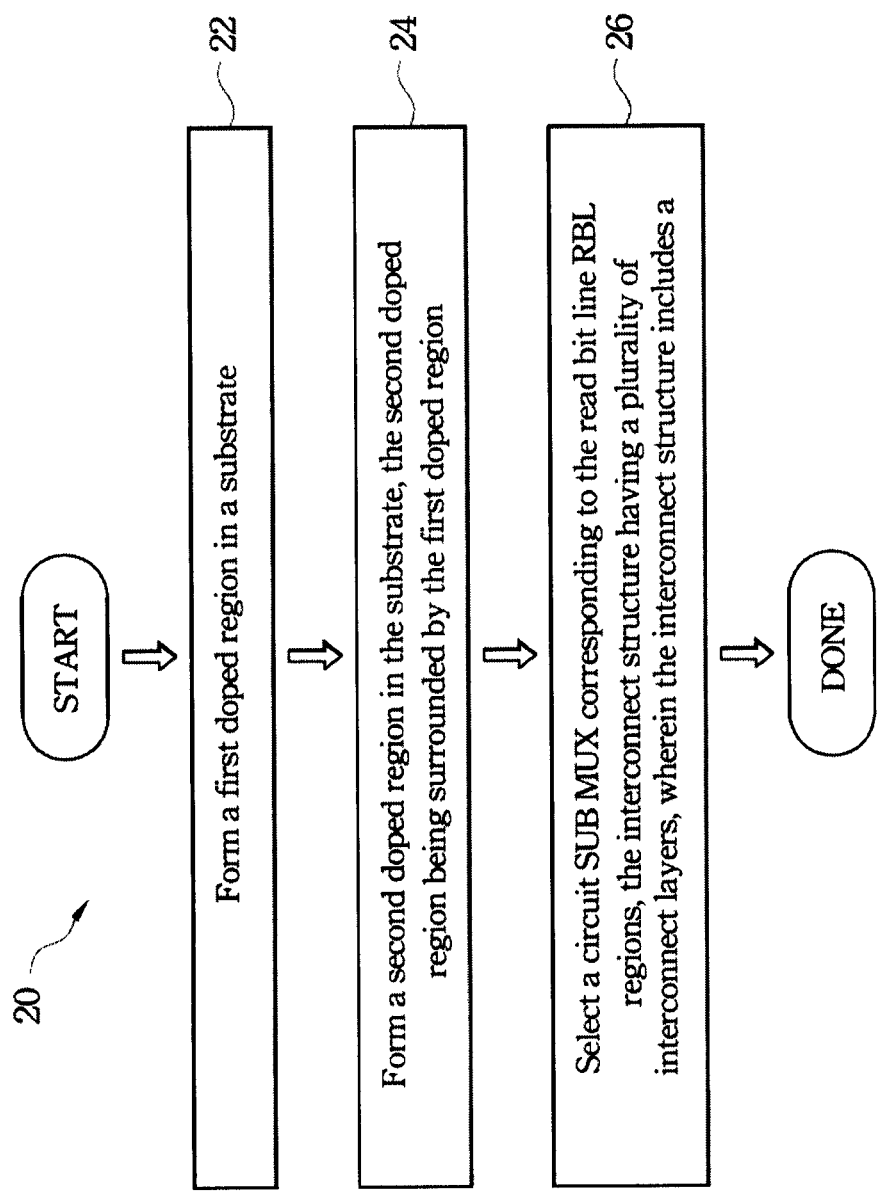
FIG. 1 is a flowchart illustrating a method for fabricating a semiconductor device according to various aspects of the present disclosure.

Illustrated in FIG. 1 is a flowchart of a method 20 according to various aspects of the present disclosure. The method 20 begins with block 22 in which a first doped region is formed in a substrate. The method 20 continues with block 24 in which a second doped region is formed in the substrate. The second doped region is oppositely doped from the first doped region. The second doped region is being at least partially surrounded by the first doped region. The method 20 continues with block 26 in which an interconnect structure is formed over the first and second doped regions. The interconnect structure has a plurality of interconnect layers. The forming of the interconnect structure includes forming a resistor in one of the interconnect layers. The resistor has a spiral shape and has first and second portions that are coupled to the first and second doped regions, respectively.

Figure 2:
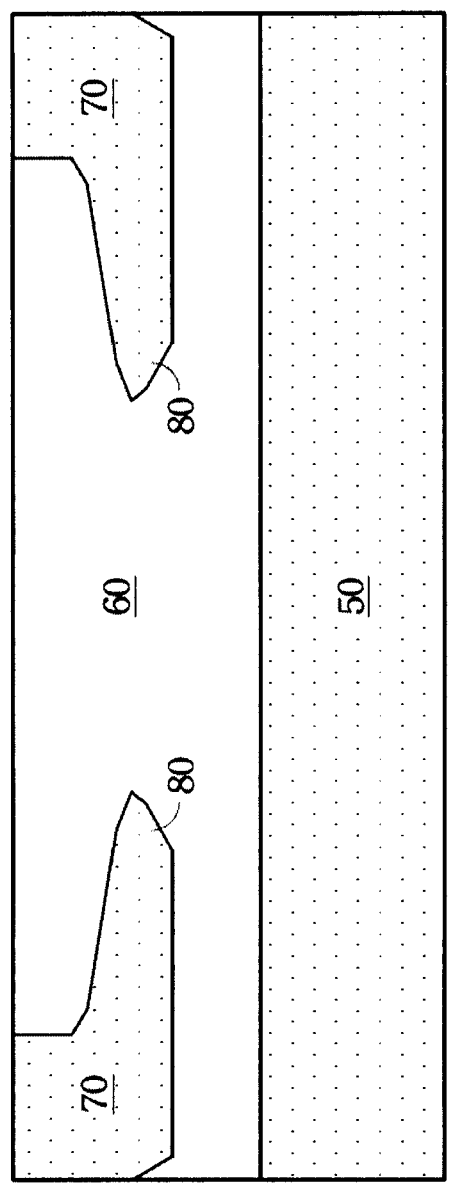
FIGS. 2-4 are diagrammatic fragmentary cross-sectional side views of a portion of a wafer at various stages of fabrication in accordance with various aspects of the present disclosure.
Figure 3:
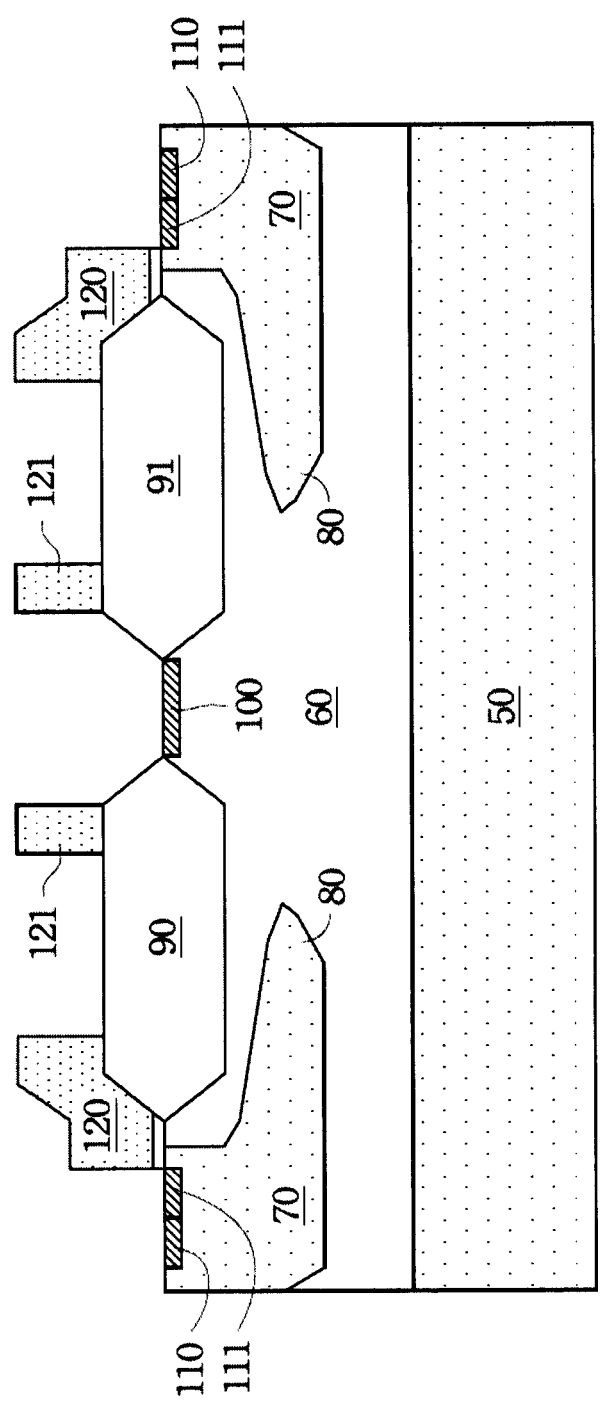
Figure 4:
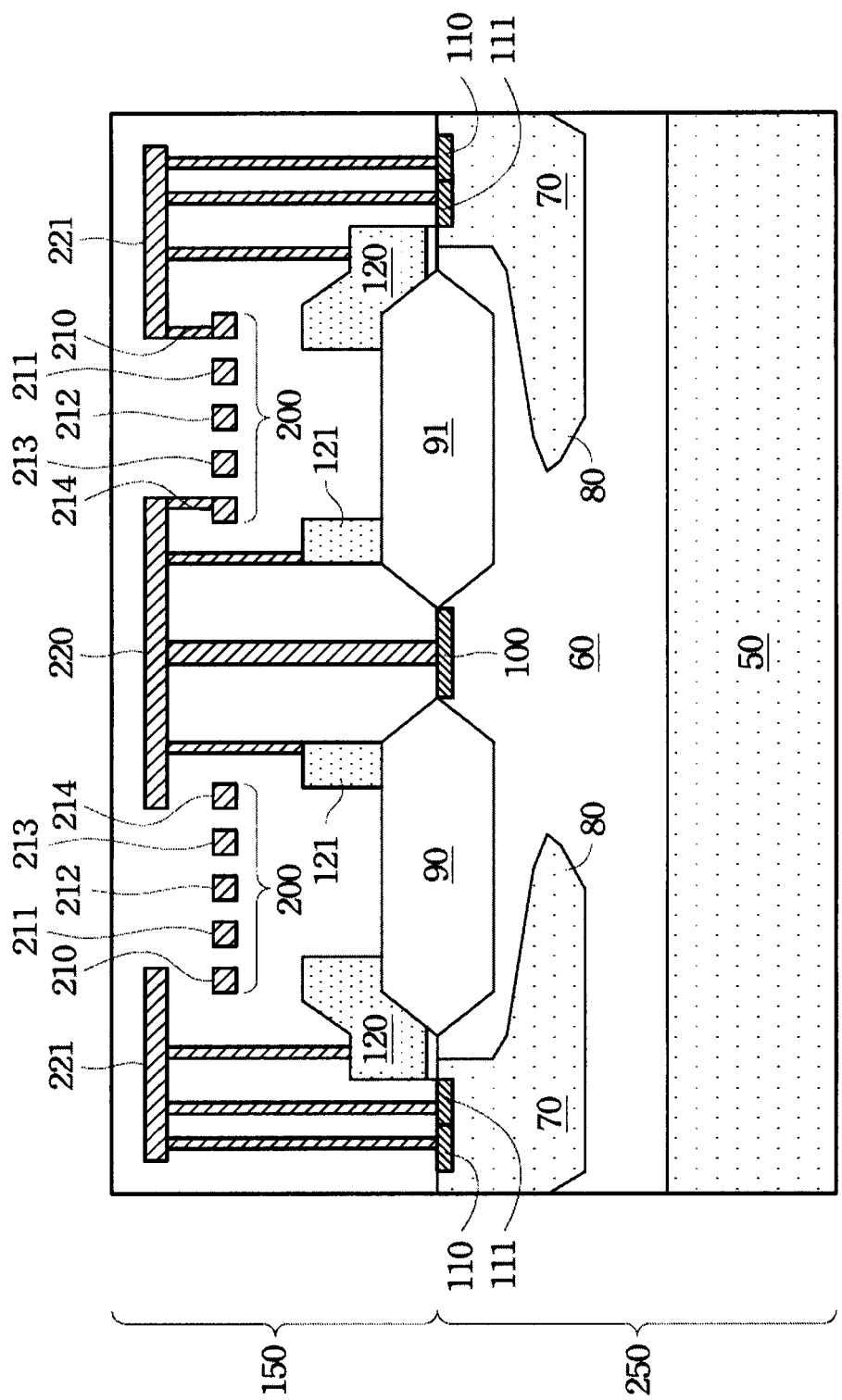
Figure 5:
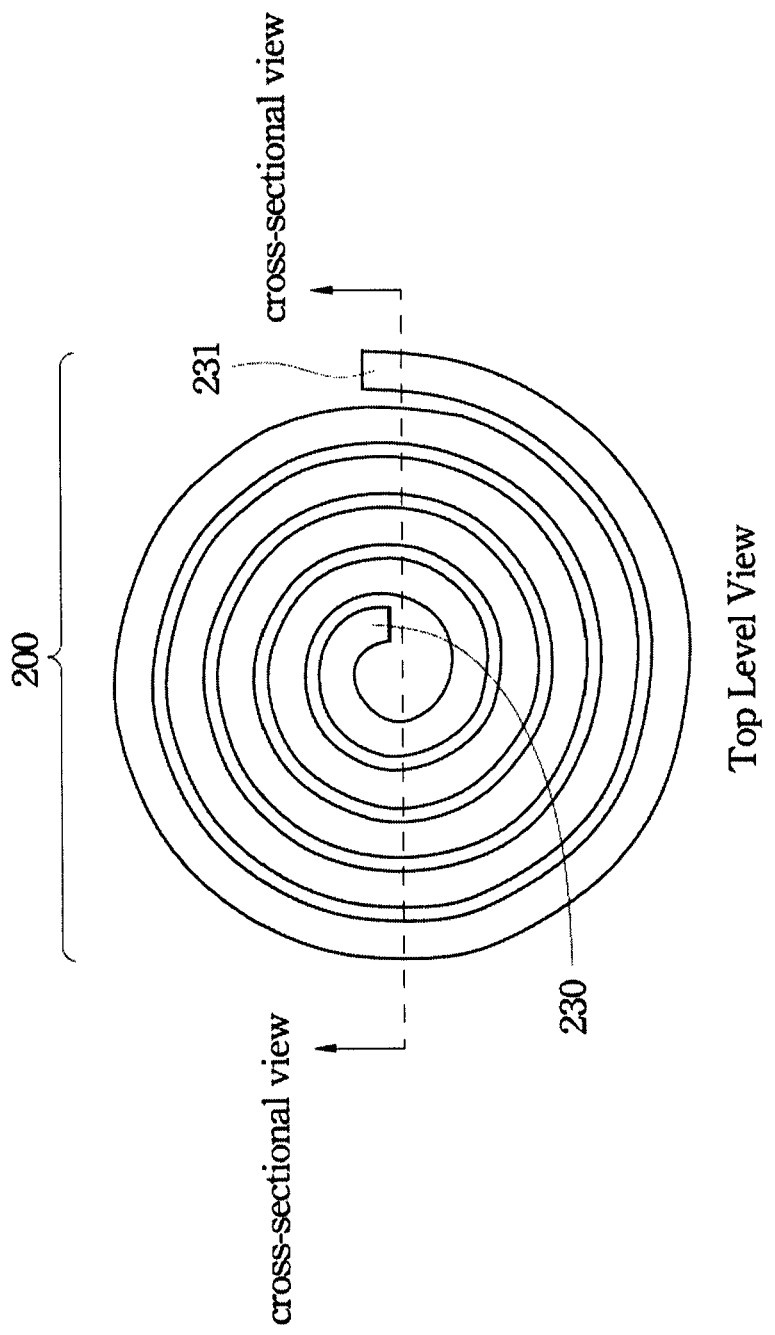
FIGS. 5-6 are diagrammatic top level views of different components on the wafer in accordance with various aspects of the present disclosure.
Figure 6:
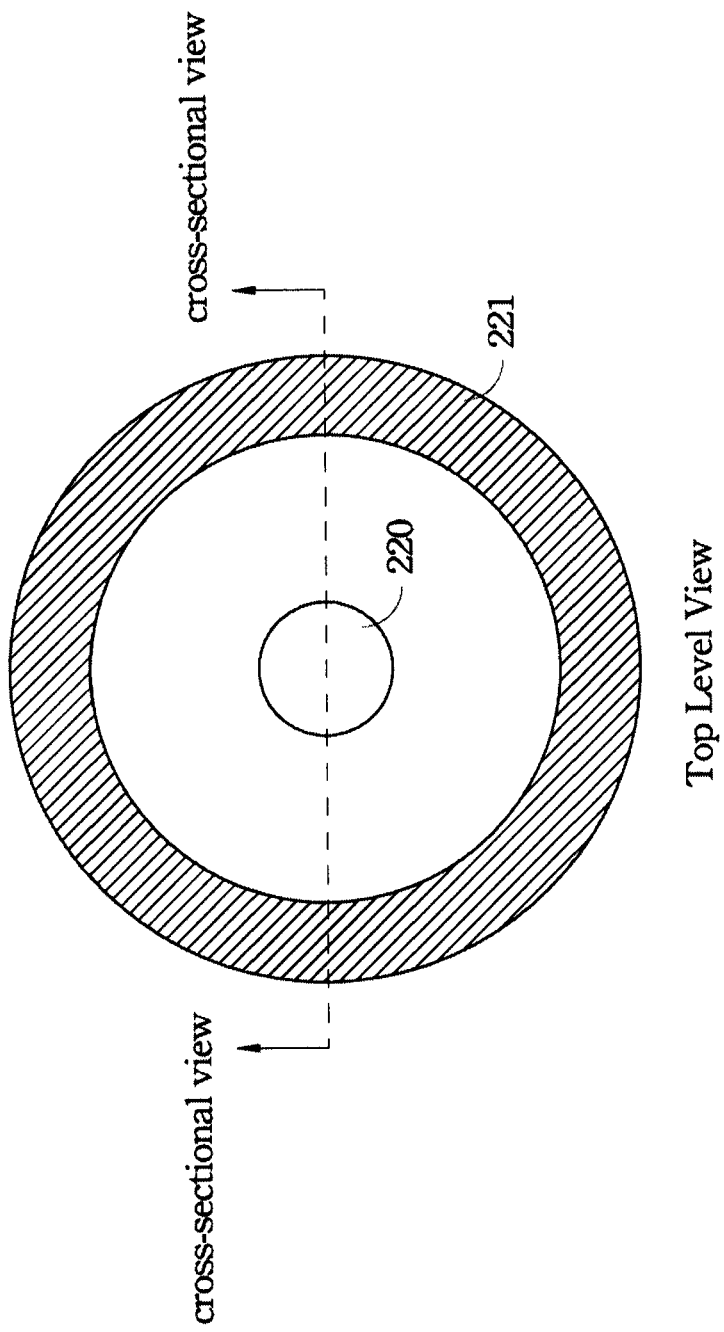

FIGS. 2-4 are diagrammatic fragmentary cross-sectional side views of various portions of a semiconductor wafer at various fabrication stages according to embodiments of the present disclosure. FIGS. 5-6 are diagrammatic fragmentary top level views of various components on the wafer according to the embodiments of the present disclosure. It is understood that FIGS. 2 to 6 have been simplified for a better understanding of the inventive concepts of the present disclosure.

Referring to FIG. 2, a portion of a substrate 50 is illustrated. The substrate 50 is doped with a P-type dopant such as boron. In another embodiment, the substrate 50 may be doped with an N-type dopant such as phosphorous or arsenic. The substrate 50 may also include other suitable elementary semiconductor materials, such as diamond or germanium; a suitable compound semiconductor, such as silicon carbide, indium arsenide, or indium phosphide; or a suitable alloy semiconductor, such as silicon germanium carbide, gallium arsenic phosphide, or gallium indium phosphide. Further, the substrate 50 could include an epitaxial layer (epi layer), may be strained for performance enhancement, and may include a silicon-on-insulator (SOI) structure.

A doped region 60 is formed within the substrate 50 by doping an upper portion of the substrate 50. The doped region 60 is formed in a manner so that it is at least partially surrounded by the substrate 50. The doped region 60 has a doping polarity that is opposite from the doping polarity of the substrate 50. Thus, in the embodiment where the substrate 50 is doped with a P-type dopant, then doped region 60 is doped with an N-type dopant. The doped region 60 may be referred to as a drift region, for example as an N-drift region when it is doped with the N-type dopant.

A doped region 70 is also formed within the substrate 50. The doped region 70 is formed in a manner so that it is disposed adjacent to the doped region 60. The doped region 70 has a portion 80 that extends or protrudes into the doped region 60. The doped region 70 may be referred to as a boosted-shape body region, for example, a boosted-shape P-body region when it is doped with the P-type dopant. Also, although it cannot be seen from the cross-sectional side view illustrated in FIG. 2, the doped region 70 actually surrounds the doped region 60 in an approximately circular manner from a top view.

Referring now to FIG. 3, isolation structures 90 and 91 are formed in the doped region 60. In the embodiment shown in FIG. 3, the isolation structures 90 and 91 include Local Oxidation of Silicon (LOCOS) devices. The LOCOS devices may be formed using a nitride mask and thermal-growing an oxide material through the mask openings. Alternatively, the isolation structures 90 and 91 may include shallow trench isolation (STI) devices or deep trench isolation (DTI) devices.

Thereafter, a heavily doped region 100 is formed in a portion of the doped region 60 between the isolation structures 90 and 91. The heavily doped region 100 has the same doping polarity as the doped region 60, but with a heavier doping concentration. For example, in an embodiment where the doped region 60 is an N-drift region, the heavily doped region 100 is an N+ region.

Heavily doped regions 110 and 111 are also formed in an upper portion of the doped region 70. The heavily doped region 110 has the same doping polarity as the doped region 70 but with a heavier doping concentration. For example, in an embodiment where the doped region 70 is a P-body region, the heavily doped region 110 is a P+ region. The heavily doped region 110 may be referred to as a bulk contact. The heavily doped region 111 has the same doping polarity as the doped region 60 (or opposite that of the heavily doped region 110) but with a heavier doping concentration. For example, in an embodiment where the doped region 60 is an N-drift region, the heavily doped region 111 is an N+ region.

Polysilicon devices 120 and 121 are formed partially over the isolation structures 90-91. The polysilicon device 120 may serve as a gate of a semiconductor transistor device. The doped region 60 may serve as a drain region of the semiconductor device, and the doped region 70 may serve as a source region of the semiconductor device, or vice versa. A channel region of the semiconductor device is located in a portion of the doped region 70 directly below or underneath the gate 120. The polysilicon device 121 may serve as a "metal shorting" device, which allows for the reduction of electric fields near sharp corners.

Referring now to FIG. 4, an interconnect structure 150 is formed over the doped regions 60 and 70 and the isolation structures 90-91. The interconnect structure 150 includes a plurality of patterned dielectric layers and conductive layers that provide interconnections (e.g., wiring) between circuitries, inputs/outputs, and various doped features, for example, the doped regions 60, 70, and 110-111.

In more detail, the interconnect structure 150 may include a plurality of interconnect layers, also referred to as metal layers. Each of the interconnect layers includes a plurality of interconnect features, also referred to as metal lines. The metal lines may be aluminum interconnect lines or copper interconnect lines, and may include conductive materials such as aluminum, copper, aluminum alloy, copper alloy, aluminum/silicon/copper alloy, titanium, titanium nitride, tantalum, tantalum nitride, tungsten, polysilicon, metal silicide, or combinations thereof. The metal lines may be formed by a process including physical vapor deposition (PVD), chemical vapor deposition (CVD), sputtering, plating, or combinations thereof.

The interconnect structure 150 includes an interlayer dielectric (ILD) that provides isolation between the interconnect layers. The ILD may include a dielectric material such as a low-k material or an oxide material. The interconnect structure 150 also includes a plurality of vias/contacts that provide electrical connections between the different interconnect layers and/or the features on the substrate, such as the doped regions 60, 70, and 110-111.

A resistor 200 is formed in one of the interconnect layers of the interconnect structure 150. The resistor 200 may be formed at the same time as other metal lines in the interconnect layer, and may include the same materials as the metal lines, such as aluminum or copper.

The resistor 200 has a substantially spiral shape and includes a plurality of turns or windings. The cross-sectional view of five of such turns/windings are shown in FIG. 4 and designated as 210-214, though it is understood that the resistor 200 may have any other number of turns/windings. The turns/windings 210-214 are spaced apart approximately evenly. In an embodiment, the turns/windings 210-214 each have a lateral dimension (or width) that is in a range from about 0.5 microns (um) to about 2 um, and the spacing between the adjacent turns/windings is in a range from about 0.5 um to about 2 um.

In an interconnect layer above the interconnect layer containing the resistor 200, connection terminals 220 and 221 are formed. For example, if the resistor 200 is formed in a metal-1 layer, then the connection terminals 220-221 are formed in a metal-2 layer. It is understood, however, that the connection terminals 220-221 may be formed in other interconnect layers in alternative embodiments. The connection terminals 220-221 are formed at the same time as other metal lines in the interconnect layer, and may include the same materials as the metal lines, such as aluminum or copper. Thus, the connection terminals 220-221 may be considered as metal lines too.

Although it can't be seen from the cross-sectional view of FIG. 4, the connection terminal 220 has a substantially circular or round shape from a top level view, and the connection terminal 221 has a substantially circular ring shape from a top level view. The top level views of an embodiment of the resistor 200 and the connection terminals 220 and 221 are respectively illustrated in FIGS. 5-6 for the sake of clarity and providing an example.

Referring to FIG. 5, a top level view of an embodiment of the resistor 200 is illustrated. As is shown, the resistor 200 has a substantially spiral shape. From the top level view, the resistor 200 is a continuous metal line, but it may be conceptually divided into a plurality of portions or segments. For example, the resistor may have opposite end or tip portions 230 and 231. The end portion 230 may be referred to as an inner (or inside) end portion/segment, and the end portion 231 may be referred to as an outer (or outside) end portion/segment. If a cross-sectional view is taken from the perspective of the broken line shown, the distinct turns/windings similar to the turns/windings 210-214 of FIG. 4 will be observed.

Referring to FIG. 6, a top level view of an embodiment of the connection terminals 220-221 is illustrated. As is shown, the connection terminal 220 has a substantially circular or round shape, and the connection terminal 221 has a substantially circular ring shape. If a cross-sectional view is taken from the perspective of the broken lines, the connection terminals 220-221 shown in FIG. 4 will be observed.

Referring back to FIG. 4, the connection terminals 220 and 221 are used to apply an electrical voltage to the resistor 200. Thus, the connection terminal 220 is either an anode terminal or a cathode terminal, and vice versa for the connection terminal 221. In an embodiment where the doped region 60 is N-type and the doped region 70 is P-type, the connection terminal 220 is an anode terminal, and the connection terminal 221 is a cathode terminal. In an embodiment where the doped region 60 is P-type and the doped region 70 is N-type, the connection terminal 220 is a cathode terminal, and the connection terminal 221 is an anode terminal.

The connection terminals 220-221 may each be coupled to any turn/winding of the resistor 200. In an embodiment, the connection terminal 220 is coupled to the end portion or tip portion of the turn/winding 214, and the connection terminal 221 is coupled to the end portion or tip portion of the turn/winding 210. Stated differently, the connection terminal 220 is coupled to and end portion similar to the end portion 230 (shown in the top level view of FIG. 5), and the connection terminal 221 is coupled to an end portion similar to the end portion 231 (shown in the top level view of FIG. 5).

By adjusting the points of coupling between the connection terminals 220-221 and the various turns/windings of the resistor 200, different resistance values of the resistor 200 may be obtained. For example, if the connection terminal 220 is coupled to both the turns/windings 213-214 (or just to the turn/winding 213), while the connection terminal 221 is coupled to the turn/winding 210, then a smaller resistance is obtained from the resistor 200. This is because the total distance of the resistor 200 (which is directly correlated to the resistance) is effectively reduced. As such, the placement of the connection terminals 220-221 may be used to implement various resistor dividers for different voltage division tasks.

As discussed previously, a semiconductor transistor device is formed by the doped regions 60 and 70 and the polysilicon device 120. This semiconductor transistor device is capable of withstanding a high voltage. For the ease of reference and for the sake of simplicity, the various regions below the interconnect structure 150 are collectively referred to as a high-voltage protection device 250.

The connection terminal 220 is coupled to the heavily doped region 100 (and thus to the doped region 60) and the polysilicon device 121. The connection terminal 221 is coupled to the heavily doped regions 110-111 (and thus to the doped region 70) and the polysilicon device 120. In other words, the connection terminal 220 is coupled to the drain of the high-voltage protection device 250, and the connection terminal 221 is coupled to the gate and source of the high-voltage protection device 250.

Since the connection terminals 220-221 are also respectively coupled to the opposite ends of resistor 200, it can be said that the resistor 200 and the high-voltage protection device 250 are electrically coupled in parallel to each other. That is, an electrical current may either take the path of the resistor 200, or take the path of the high-voltage protection device 250. Thus, if a high voltage (for example, a voltage greater than 100 volts) is applied to the resistor 200, a portion of the resulting electrical current may bypass the resistor 200 and instead flow through the high-voltage protection device 250. Consequently, a smaller amount of current flows through the resistor 200.

The reduced current flow lessens the stress on the resistor 200, thereby lowering the risk of damages to the resistor 200. In this manner, the high-voltage protection device 250 effectively increases the voltage threshold that the resistor 200 can sustain. For example, the resistor 200 may be able to withstand a voltage as high as 600 volts (or higher) without being damaged. Therefore, one of the advantages offered by the embodiments of the present disclosure is the ability to withstand high voltages. It is understood, however, that different embodiments may offer different advantages, and that no particular advantage is required for all embodiments.

Another advantage offered by the embodiments of the present disclosure is that the spiral shape of the resistor 200 reduces the presence of highly concentrated electric fields. Traditional resistors may have sharp corners or abrupt turns. The electric fields around these regions usually tend to be very strong, much stronger than electric fields elsewhere around the resistor. This means that these corner regions of the resistor tend to break down more quickly, since they are constantly under the influence of such strong electric fields. In comparison, the resistor 200 has a spiral shape and contains no sharp corners or abrupt turns. In other words, the resistor 200 is "smoothly-shaped" throughout. Thus, the electric fields may be distributed more evenly and not be as strong, thereby reducing the likelihood of a breakdown in any particular region of the resistor 200.

In addition, the spiral shape of the resistor 200 helps conserve chip real estate, in comparison to traditional resistor layouts. In some embodiments, the chip real estate can be saved up to 75%. This means that a packing density can be increased, which lowers fabrication costs. Furthermore, the processes described above are compatible with existing fabrication processes, and therefore they can be easily integrated into current manufacturing processes.

One of the broader forms of the present disclosure involves a semiconductor device that includes a resistor and a voltage protection device. The resistor has a spiral shape. The resistor has a first portion and a second portion. The voltage protection device includes a first doped region that is electrically coupled to the first portion of the resistor. The voltage protection device includes a second doped region that is electrically coupled to the second portion of the resistor. The first and second doped regions have opposite doping polarities.

Another of the broader forms of the present disclosure involves a semiconductor device that includes a substrate having first and second oppositely doped regions. The first doped region at least partially surrounds the second doped region. The semiconductor device includes an interconnect structure that is disposed over the first and second doped regions. The interconnect structure has a plurality of interconnect layers. The semiconductor device includes a spiral resistor that is disposed in one of the interconnect layers. The spiral resistor has first and second segments. Wherein: the first segment of the spiral resistor is coupled to one of the first and second doped regions, and the second segment of the spiral resistor is coupled to the other one of the first and second doped regions.

Still another of the broader forms of the present disclosure involves a method. The method includes: forming a first doped region in a substrate; forming a second doped region in the substrate, the second doped region being oppositely doped from the first doped region and being at least partially surrounded by the first doped region; and forming an interconnect structure over the first and second doped regions, the interconnect structure having a plurality of interconnect layers. Wherein the forming the interconnect structure includes forming a resistor in one of the interconnect layers, the resistor having a spiral shape and having first and second portions that are coupled to the first and second doped regions, respectively.

The foregoing has outlined features of several embodiments so that those skilled in the art may better understand the detailed description that follows. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions and alterations herein without departing from the spirit and scope of the present disclosure.

What is claimed is:

1. A method, comprising:
   forming a first doped region in a substrate;
   forming a second doped region in the substrate, the second doped region being oppositely doped from the first doped region and being at least partially surrounded by the first doped region;
   forming third and fourth doped regions in the first doped region, the third and fourth doped regions being oppositely doped and having greater dopant concentrations than the first and second doped regions, respectively, wherein the fourth doped region has an edge directly interfacing with an edge of the third doped region; and forming an interconnect structure over the first and second doped regions, the interconnect structure having a plurality of interconnect layers;

wherein the forming the interconnect structure includes forming a resistor in one of the interconnect layers, the resistor having a spiral shape and having first and second portions that are coupled to the first and second doped regions, respectively.

2. The method of claim 1, wherein the forming the first doped region is carried out in a manner so that the first doped region is formed in a portion of the substrate that is oppositely doped from the first doped region.

3. The method of claim 1, wherein the forming the first doped region and the forming the second doped region are carried out in a manner so that:

the first doped region includes a portion that extends at least partially into the second doped region; and the first doped region completely surrounds the second doped region in an approximately circular manner from a top level view.

4. The method of claim 1, further including:

forming a polysilicon device partially over the first and second doped regions; and coupling the polysilicon device to the first portion of the resistor.

5. The method of claim 1, wherein the forming the interconnect structure includes:

forming metal lines in the interconnect layers; and forming vias that interconnect the metal lines;

and wherein:

the first and second portions of the resistor are coupled to the first and second doped regions through the metal lines and vias.

6. The method of claim 1, wherein the forming the resistor is carried out in a manner so that:

the resistor includes a plurality of turns that are substantially evenly spaced apart;

the first portion of the resistor includes an outer end portion of the resistor; and the second portion of the resistor includes an inner end portion of the resistor.

7. The method of claim 1, further including, before the forming the interconnect structure:

forming a fifth doped region in the second doped region, the fifth doped region having the same doping polarity as the second doped region and having a greater dopant concentration than the second doped region;

and wherein:

the first portion of the resistor is coupled to both the third and fourth doped regions; and the second portion of the resistor is coupled to the fifth doped region.

8. The method of claim 1, wherein the interconnect structure includes a first metal via physically contacting the third doped region to electrically couple the resistor to the third doped region, and wherein the interconnect structure includes a second meta via physically contacting the fourth doped region to electrically couple the resistor to the fourth doped region.

9. A method comprising:

forming a first doped region of a first type of conductivity in a substrate;

forming a second doped region of a second type of conductivity in the substrate;

forming a third doped region of the first type of conductivity in the first doped region, wherein the third doped region is more heavily doped than the first doped region;

forming a fourth doped region in the second doped region, wherein the fourth doped region is more heavily doped than the second doped region;

forming a fifth doped region of the second type of conductivity in the first doped region, wherein the fifth doped region has an edge directly interfacing with an edge of the third doped region in the first doped region;

forming a dielectric isolation structure within the substrate and extending between the third doped region and the fourth doped region; and forming a spiral resistor over the first and second doped regions, wherein the spiral resistor has a first segment coupled to one of the first and second doped regions and wherein the spiral resistor has a second segment coupled to the other one of the first and second doped regions.

10. The method of claim 9, further comprising forming a gate on the dielectric isolation structure.

11. The method of claim 10, wherein one of the first and second segments of the spiral resistor is coupled to the gate.

12. The method of claim 9, wherein the first doped region extends within the substrate directly under the isolation structure.

13. The method of claim 9, wherein the spiral resistor is disposed within an interconnect structure disposed over the substrate such that the interconnect structure includes a first metal via physically contacting the third doped region to electrically couple the resistor to the third doped region, and wherein the interconnect structure includes a second meta via physically contacting the fifth doped region to electrically couple the resistor to the fifth doped region.

14. The method of claim 13, wherein the interconnect structure includes a third metal via physically contacting the fourth doped region to electrically couple the resistor to the fourth doped region.

15. A method comprising:

forming a first doped region of a first type of conductivity in a substrate;

forming a second doped region of a second type of conductivity in the substrate;

forming a third doped region of the first type of conductivity in the first doped region, wherein the third doped region is more heavily doped than the first doped region;

forming a fourth doped region of the second type of conductivity in the first doped region, wherein the fourth doped region is more heavily doped than the first doped region, wherein the fourth doped region has an edge directly interfaces with an edge of the third doped region;

forming a fifth doped region in the second doped region, wherein the fifth doped region is more heavily doped than the second doped region; and forming a spiral resistor over the first and second doped regions, wherein the spiral resistor has a first segment coupled to one of the first and second heavily doped regions and wherein the spiral resistor has a second segment coupled to the third heavily doped region.

16. The method of claim 15, wherein the fifth doped region in the second doped region has the second type of conductivity.

17. The method of claim 15, further comprising forming a dielectric isolation structure within the substrate and extending between the fourth doped region and the fifth doped region.

18. The method of claim 17, further comprising forming a gate directly over a portion of the first doped region and directly over a portion of the dielectric isolation structure.

19. The method of claim 18, wherein the first segment of the spiral resistor is coupled to the gate.

20. The method of claim 17, further comprising forming a gate directly over only the dielectric isolation structure, wherein the second segment of the spiral resistor is coupled to the gate.

* * * * *